United States Patent
Nesteruk et al.

(10) Patent No.: US 6,950,063 B2
(45) Date of Patent: Sep. 27, 2005

(54) INTRALUMINAL MRI PROBE

(75) Inventors: Krzysztof Nesteruk, Warszawa (PL); Jaroslaw Wosik, Houston, TX (US); Leiming P. Xie, Houston, TX (US); James T. Willerson, Houston, TX (US); Samuel Ward Casscells, Houston, TX (US); Morteza Naghavi, Houston, TX (US)

(73) Assignees: The Board of Regents of the University of Texas System, Austin, TX (US); The University of Houston, Houston, TX (US)

( * ) Notice: Subject to any disclaimer, the term of this patent is extended or adjusted under 35 U.S.C. 154(b) by 433 days.

(21) Appl. No.: 10/188,788

(22) Filed: Jul. 3, 2002

(65) Prior Publication Data

US 2004/0004477 A1 Jan. 8, 2004

(51) Int. Cl.$^7$ .............................. G01R 3/327; A61B 5/05
(52) U.S. Cl. ........................................ 342/423; 600/410
(58) Field of Search .................................. 324/423, 307, 324/308, 309, 306; 600/407, 410, 411, 419

(56) References Cited

U.S. PATENT DOCUMENTS

| | | |
|---|---|---|
| 4,672,972 A | 6/1987 | Berke |
| 5,699,801 A | 12/1997 | Atalar et al. |
| 6,171,240 B1 | 1/2001 | Young et al. |
| 6,615,071 B1 | 9/2003 | Casscells, III et al. |

*Primary Examiner*—Daniel Robinson
(74) *Attorney, Agent, or Firm*—Duane Morris LLP (57) ABSTRACT

The present invention relates to an intraluminal magnetic resonance imaging (MRI) probe which may be used for intraluminal MRI. The present invention is sized sufficiently small to be inserted into a patient intraluminally. The probe of the present invention comprises a substrate having a dielectric constant in the range of 1–1000, and first and second conducting layers on each side of the dielectric. The present invention is configured to result in a distributed capacitance.

4 Claims, 9 Drawing Sheets

INTRALUMINAL MRI PROBE

BACKGROUND OF THE INVENTION

1. Field of the Invention

The present invention relates to an intraluminal magnetic resonance imaging (MRI) probe which may be used for intraluminal MRI. The present invention is sized sufficiently small to be inserted into a patient intraluminally. The probe of the present invention comprises a substrate having a dielectric constant in the range of 1–1000, and first and second conducting layers on each side of the dielectric. The present invention is configured to result in a distributed capacitance.

2. Description of the Prior Art

Prior art MRI probes exist in a variety of geometrical configurations. U.S. Pat. No. 5,699,801 to Atalar (Athe>801 Patent≅) discloses an MRI probe having pair of electrodes arranged in a parallel configuration and embedded within a dielectric material. FIG. 8 of the >801 Patent discloses a probe embodiment comprising two pairs of electrodes extending through a dielectric material and positioned in planes oriented at 90 degrees relative to each other.

U.S. Pat. No. 4,672,972 to Berke (Athe>972 Patent≅) discloses an NMR probe embedded within a probe head region disposed at the distal end of a catheter/endoscope. FIG. 4 of the >972 Patent discloses an integrated circuit probe for converting the detected NMR spectra into an electrical signal having a frequency $f_S$.

U.S. Pat. No. 6,171,240 to Young et al. (Athe>240 Patent≅) discloses a radio frequency (ARF≅) probe adapted for use in MRI comprising a loop of an elongated electrical conductor arranged to form a twisted wire pair and a means for operating the probe in a transmit and receive mode for intraluminal MRI.

It is desirable have a RF probe that is small enough for intraluminal insertion, in which has a confined electric field due to distributed capacitance. The use of distributed capacitance will eliminate losses due to electric field lines penetrating the body and inducing eddy currents. Such a design will be less sensitive to flowing blood, which is normally encountered in intraluminal applications. A distributed capacitance design will also result in an RF probe that has a higher signal to noise ratio and a higher quality factor than is available with nondistributed capacitance. The term Aquality factor,≅ as used herein, is defined as the ratio of energy stored to energy loss in the resonator during one RF cycle. The present invention provides an RF probe for intraluminal MRI that is small enough for intraluminal applications and which has a distributed capacitance.

SUMMARY OF THE INVENTION

The present invention is directed toward an intraluminal MRI probe for intraluminal MRI applications. An RF coil produces both an electric and magnetic field. The probe of the present invention is designed to keep the electric field away from tissues in intraluminal applications. This is done because in the presence of tissue, electric fields introduce additional losses and detune the RF coil. The present invention employs a double sided dielectric plate design to reduce the presence of the electric field in the body. This design feature also serves the objective of producing distributed capacitance since the electric field is confined in the substrate and does not penetrate into the body.

In describing the present invention, it is useful to define a number of terms applicable to design parameters or design objectives of the present invention. The term Asensitivity region≅ as used herein, refers to the volume in which the MRI probe can produce any measurable RF magnetic field. The term Aregion of interest≅ as used herein, is part of the sensitive region where imaging is intended. The present invention is intended for use in imaging the walls of lumnes in the body, such as arteries. The term Auseable RF magnetic field≅ as used herein, refers to a component of the RF magnetic field ($B_{RF}$) perpendicular to the direction of the dc field, also known as Z axis. The useable RF magnetic field is the component of $B_{RF}$ on the XY plane. The term Auniformity≅ as used herein, is a measure of spacial variation of sensitivity over the region of interest. An indicia of good uniformity is an image without intense bright and dark areas.

The sensitivity at a specific point is proportional to the XY component of the RF magnetic field. It is a measure of how efficiently the probe converts useful RF magnetic field into voltage or converts voltage into useful RF magnetic field. It is desirable to maximize both sensitivity and uniformity over the region of interest. A means of achieving high sensitivity is storing large potential energy in the region of interest. This may be accomplished by maximizing the volumetric ratio between the region of interest and the sensitivity region.

The present invention is directed toward an MRI probe or resonator comprising a double sided dielectric comprising a conducting layer on each side. The design of the present invention provides a distributed capacitance between the conducting layers. The present invention is also directed toward cylindrical and rectangular prism shaped MRI probes or resonators. The conducting layers are configured so as to produce an electromagnetic field having a useful RF magnetic field component perpendicular to the longer dimension of the resonator. The electric field is confined primarily to the dielectric substrate. An advantage of the present invention is that the electric field does not penetrate into tissue, thereby reducing losses. The magnetic field of the resonator of the present invention is similar to that produced by a single loop; however, it can also be extended into a quadrupole configuration.

It is known to those of ordinary skill in the resonator art that (a) the resonant frequency of resonator, f, is inversely proportional to the product of the square root of the inductance, L, and the capacitance, C., (b) for a double sided resonator, the inductance, L, is proportional to the length of the coils, l, (c) the capacitance of the resonator is proportional to the product of the surface area of the conducting layer patterns, and the relative dielectric constant, 0, and (d) capacitance is also inversely proportional to the substrate thickness, d. Thus, from these relationships, it is clear that the resonant frequency is proportional to the square root of: the substrate thickness divided by the product of (a) the length, (b) the relative dielectric constant, and (c) the surface area.

DESCRIPTION OF THE PREFERRED EMBODIMENTS

Figure 1:
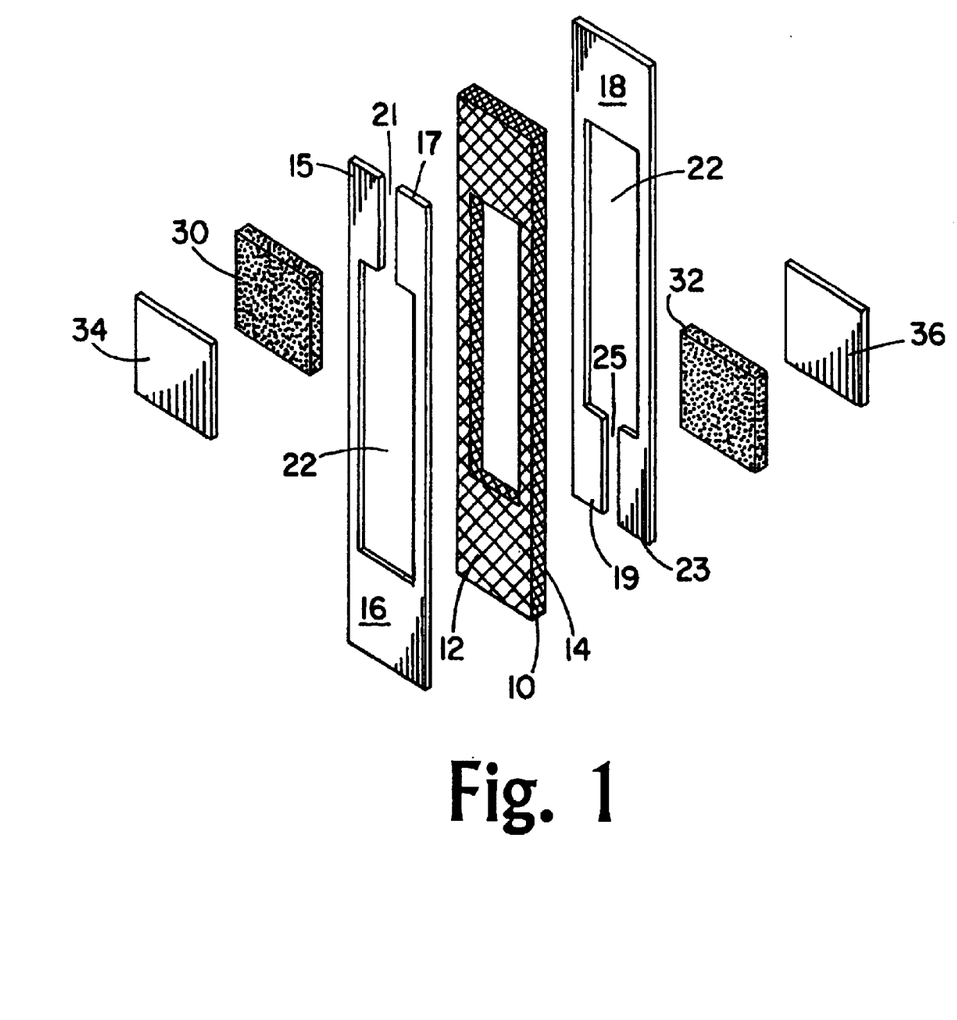
FIG. 1 is an exploded isometric view of a flat embodiment of the present invention.
Figure 7:
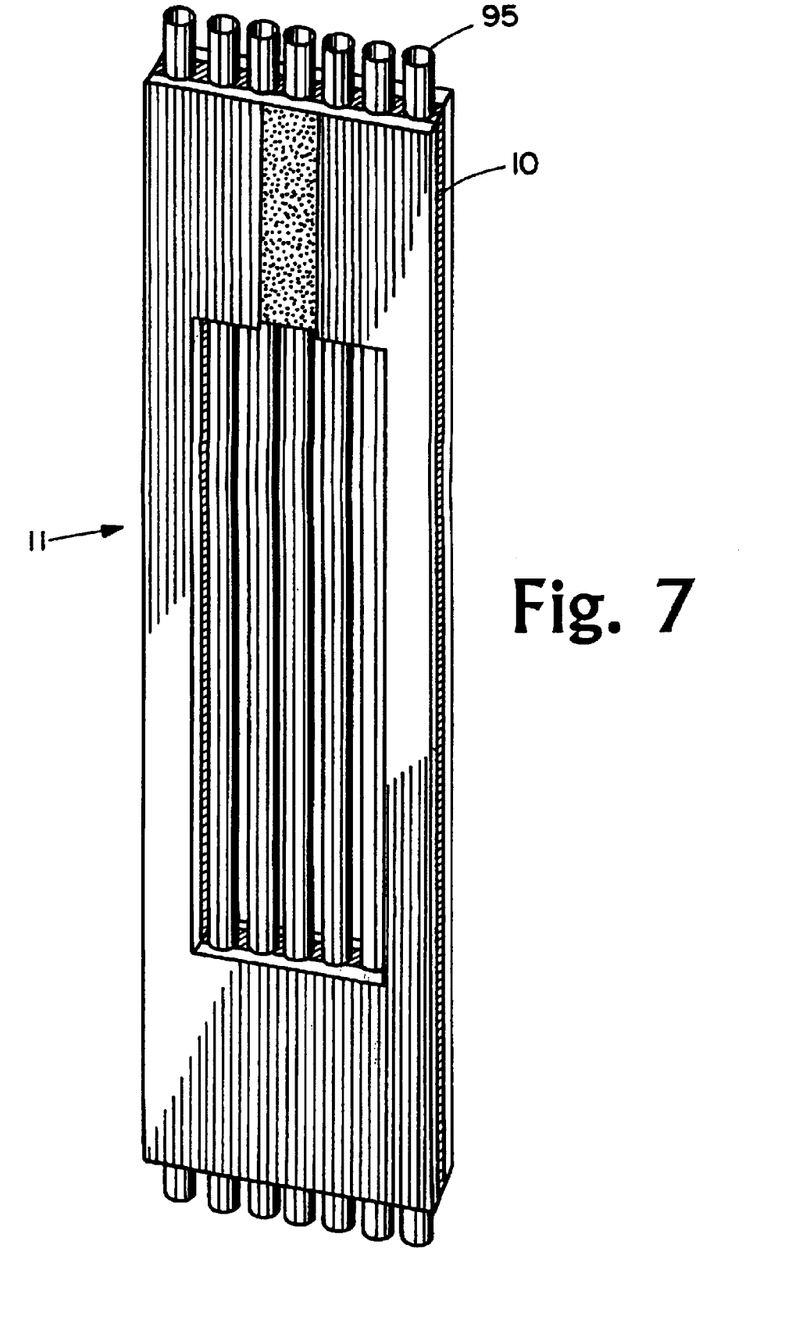
FIG. 7 is a cross sectional view of an embodiment of the present invention comprising cooling tubes.
Figure 8:
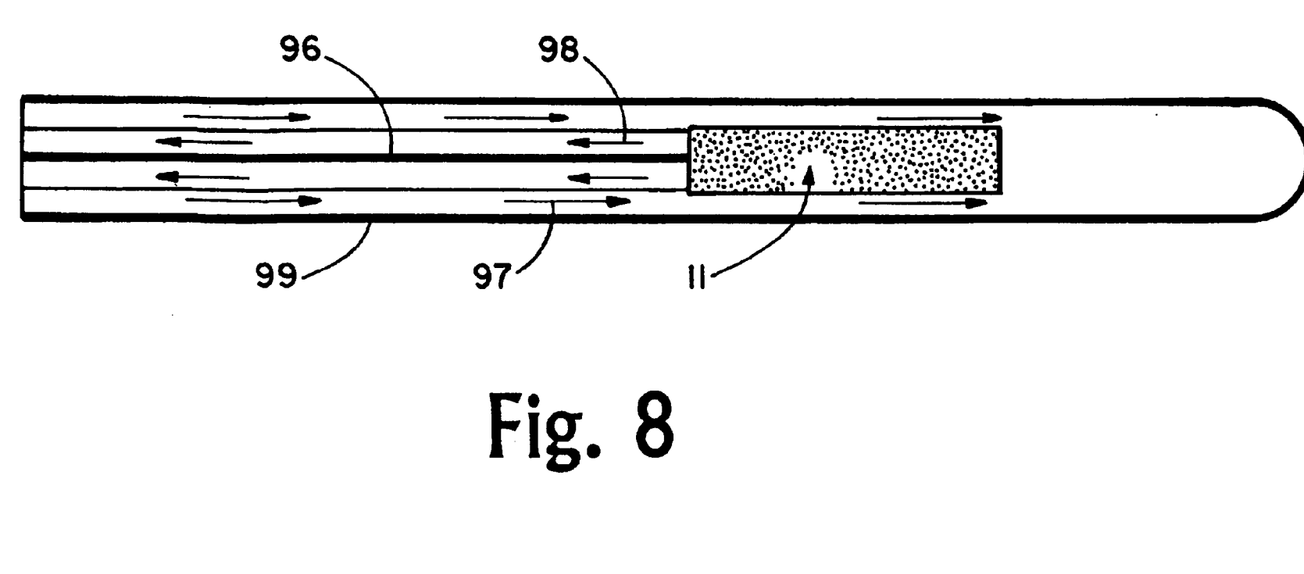
FIG. 8 is a top view of an embodiment of the present invention comprising a heat conducting handle immersed in a cooling fluid reservoir.

In one embodiment, the invention is directed to an intraluminal MRI probe comprising a dielectric 10 having a thickness in the range of 1–3000 microns, a dielectric constant in the range of 1–1000, a first surface 12 having a surface area in the range of 0.5–10,000 square millimeters, and second surface 14, having a surface area in the range of 0.5–10,000 square millimeters, as shown in FIG. 1. The invention further comprises a first conducting layer 16 deposited on the first surface, and a second conducting layer 18 deposited on the second surface, as shown in FIG. 1. The combination of the dielectric, first conducting layer and second conducting layer is referred to herein as a Adielectric sandwich, as shown in FIGS. 7–8.≅

Figure 2:
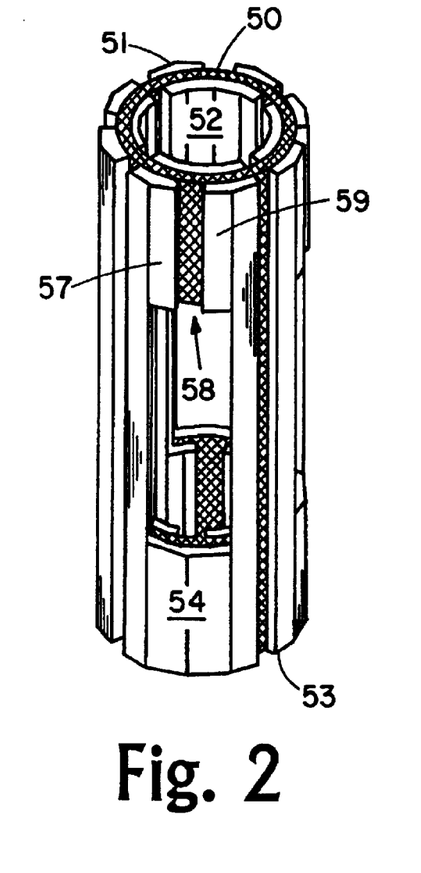
FIG. 2 is an isometric view of a first cylindrical embodiment of the present invention.
Figure 3:
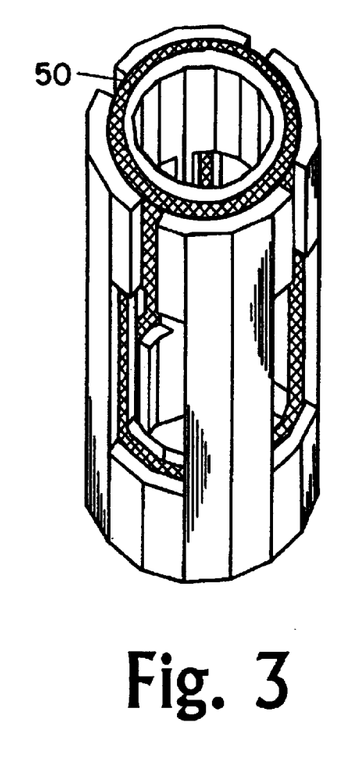
FIG. 3 is an isometric view of a second cylindrical embodiment of the present invention.

In one preferred embodiment, the dielectric, first conducting layer, and second conducting layer are flat, as shown in FIG. 1. In another preferred embodiment, the dielectric, first conducting layer, and second conducting layer are curved, as shown in FIGS. 2–3. In a preferred curved embodiment, the curved substrate is cylindrical, and the first and second layers are cylindrical, as shown in FIGS. 2–3.

In one preferred embodiment, the first and second conducting layers comprise a central opening 22, as shown in FIG. 1. In another preferred embodiment, the first and second conducting layers comprise a material with a conductivity of at least one hundred thousand siemens per meter (S/m).

In another preferred embodiment, the first conducting layer comprises a first end 15 opposite a second end 17 to form a first gap 21, as shown in FIG. 1. In this embodiment, the second conducting layer comprises a first end 19 opposite a second end 23 to form a second gap 25, as shown in FIG. 1. In this embodiment, the invention may further comprise a first dielectric plate 30 placed over the first gap. The first dielectric plate has a dielectric constant in the range of 1–1000. In this embodiment, the invention may further comprise a second dielectric plate 32 placed over the second gap, as shown in FIG. 1. The second dielectric plate has a dielectric constant in the range of 1–1000. In this embodiment, the invention may further comprise a first conducting plate 34 placed over the first dielectric plate and a second conducting plate 36 placed over the second dielectric plate, as shown in FIG. 1.

Figure 9A:
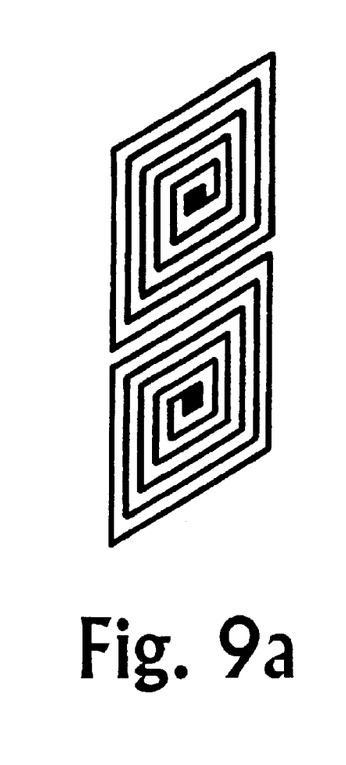
FIGS. 9a–9c are three embodiments of conducting layers of the present invention.
Figure 9B:
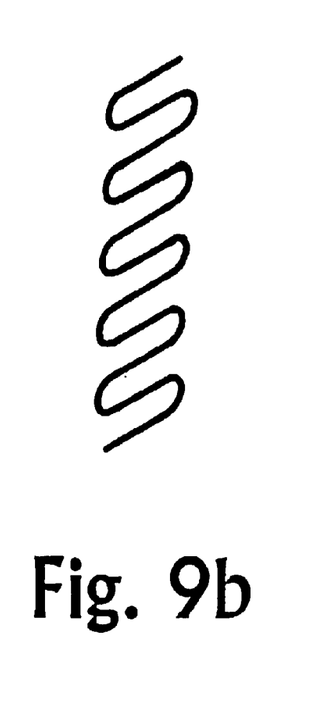
Figure 9C:
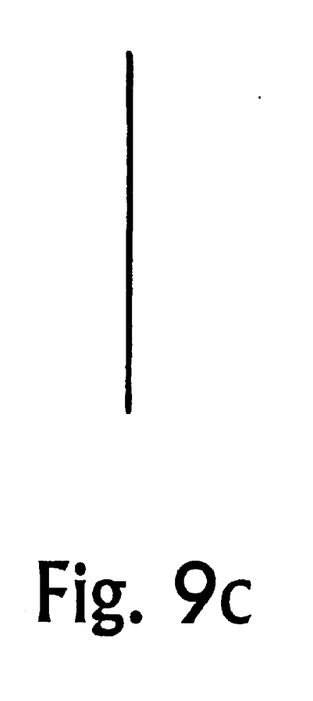

In another preferred embodiment, the first conducting layer and second conducting layer comprise a curved strip 20, as shown in FIG. 9b. In another preferred embodiment, the first and second conducting layers comprise a straight strip, as shown in FIGS. 9a and 9c. In this preferred embodiment, the first conducting layer and second conducting layer may comprise at least one right angle bend 24, as shown in FIG. 9c.

In a preferred embodiment, the dielectric sandwich of the present invention may comprise cooling or heat transfer apparatus. In a first embodiment, the dielectric sandwich, described above, comprises a multiplicity of cooling tubes 95 extending along at least one of the conducting layers or through the dielectric 10, as shown in FIG. 7. In another embodiment, a heat conducting handle 96 is in thermal conducting contact with the dielectric. The heat conducting handle extends outward from the dielectric as shown in FIG. 8. In another preferred embodiment, the heat conducting handle is contained within a cooling fluid, as shown in FIG. 8. The cooling fluid reservoir comprises coolant inlet flow paths 97, coolant outlet flow paths 98, and reservoir housing 99.

Figure 4:
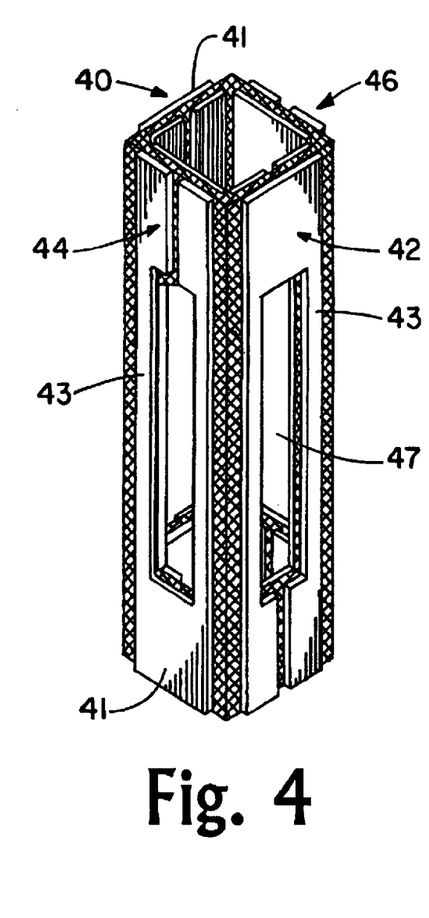
FIG. 4 is an isometric view of a first rectangular sleeve embodiment of the present invention.

Another embodiment of the present invention is directed toward a rectangular sleeve comprising four dielectric sandwiches, as described above. Each of the four dielectric sandwiches comprises two opposing short sides 41, and two opposing long sides 43. A first dielectric sandwich 40 is positioned to face a second dielectric sandwich 42, as shown in FIG. 4. A third dielectric sandwich 44 is positioned such that one of its long sides is contiguous with a long side of the first dielectric sandwich and the other of its long sides is contiguous with a long side of the second dielectric sandwich, as shown in FIG. 4. A fourth dielectric sandwich 46 is positioned to face the third dielectric sandwich such that one long side of the fourth dielectric sandwich is contiguous with a long side the first dielectric sandwich and the other long side of the fourth dielectric sandwich is contiguous with a long side of the second dielectric sandwich, as shown in FIG. 4. In this configuration, the four dielectric sandwiches define a rectangular solid internal volume and the first conducting layer of each sandwich faces this internal volume.

In a preferred rectangular sleeve embodiment, this first and second conducting layers of each dielectric sandwich comprise a central opening 47 as shown in FIG. 4. In another preferred rectangular sleeve embodiment, the first and second conducting layers of each dielectric sandwich comprise a first end opposite a second end, to form a first gap and a second gap, respectively, as shown in FIG. 1.

In another preferred embodiment of the rectangular sleeve, each conducting layer may comprise first and second dielectric plates placed over the first and second gaps, respectively and first and second conducting plates, as explained above and as shown in FIG. 1.

In a preferred rectangular sleeve embodiment, as shown in FIG. 4, the first and second gaps of the first and second conducting layers of each dielectric sandwich are positioned at opposite ends of the dielectric sandwich. For example in dielectric sandwich 42 in FIG. 4, the gap of the outwardly facing conducting layer is positioned at the lower or first end of the rectangular sleeve, while the gap of the inwardly facing conducting layer is positioned at the upper, or second, end of the rectangular sleeve.

In the preferred embodiment in FIG. 4, the gaps on adjacent outwardly facing conducting layers are positioned at opposite ends of the rectangular sleeve. Dielectric sandwiches 44 and 42 and their conducting layers are adjacent to each other. In this embodiment, the gaps on adjacent inwardly facing conducting layers are also positioned at opposite ends of the rectangular sleeve.

Figure 5:
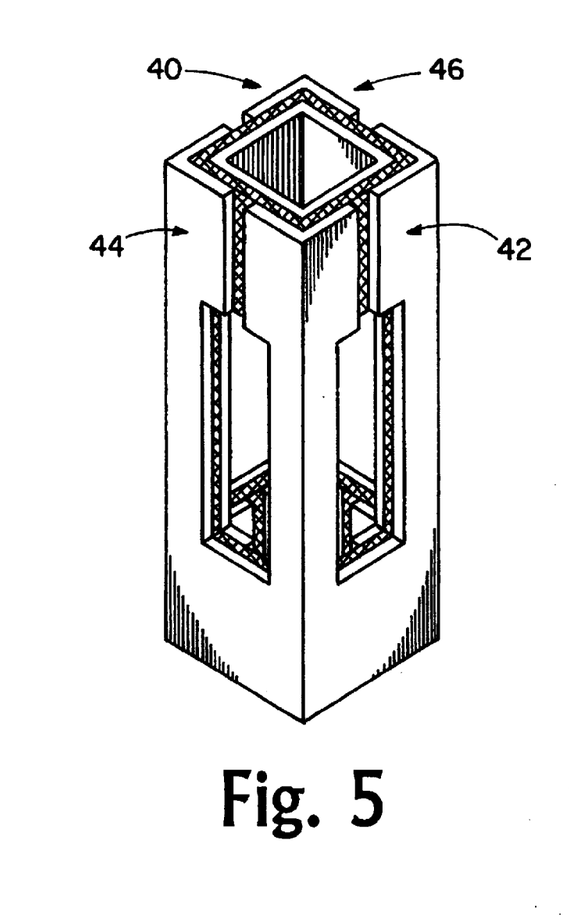
FIG. 5 is an isometric view of a second rectangular sleeve embodiment of the present invention.

In another rectangular sleeve embodiment, as shown in FIG. 5, the gaps on all outwardly facing conducting layers are positioned at the upper, or second, end of the rectangular sleeve, and the gaps on all inwardly facing conducting layers are positioned at the lower, or first, end of the rectangular sleeve.

Another embodiment of the invention is directed toward a cylindrical MRI probe, as shown in FIG. 2. This embodiment comprises a cylindrical dielectric 50 having a first substrate end 51, and second substrate end 53, a thickness in the range of 1–3,000 microns, a dielectric constant in the range 1–1,000, a first inner surface region having surface area in the range of 5–15,000 square millimeters, a second inner surface region having a surface area in the range of 5–15,000 square millimeters, a first outer surface region having a surface area in the range of 5–15,000 square millimeters, and a second outer surface region having a surface area in the range of 5–15,000 square millimeters.

This cylindrical embodiment further comprises a first inner conducting layer 52 deposited on the first inner surface region. This embodiment of the invention further comprises a second inner conducting layer deposited on the second inner surface opposite the first inner conducting layer.

In a preferred embodiment, this cylindrical embodiment of the invention further comprises a first outer conducting layer 54 deposited on the first outer surface region. This embodiment of the invention further comprises a second outer conducting layer deposited on the second outer surface region opposite the first outer conducting layer. Each inner and outer conducting layer comprises a first finger like projection 57 opposite a second finger like projection 59 to form a gap 58 as shown in FIG. 2.

Figure 10:
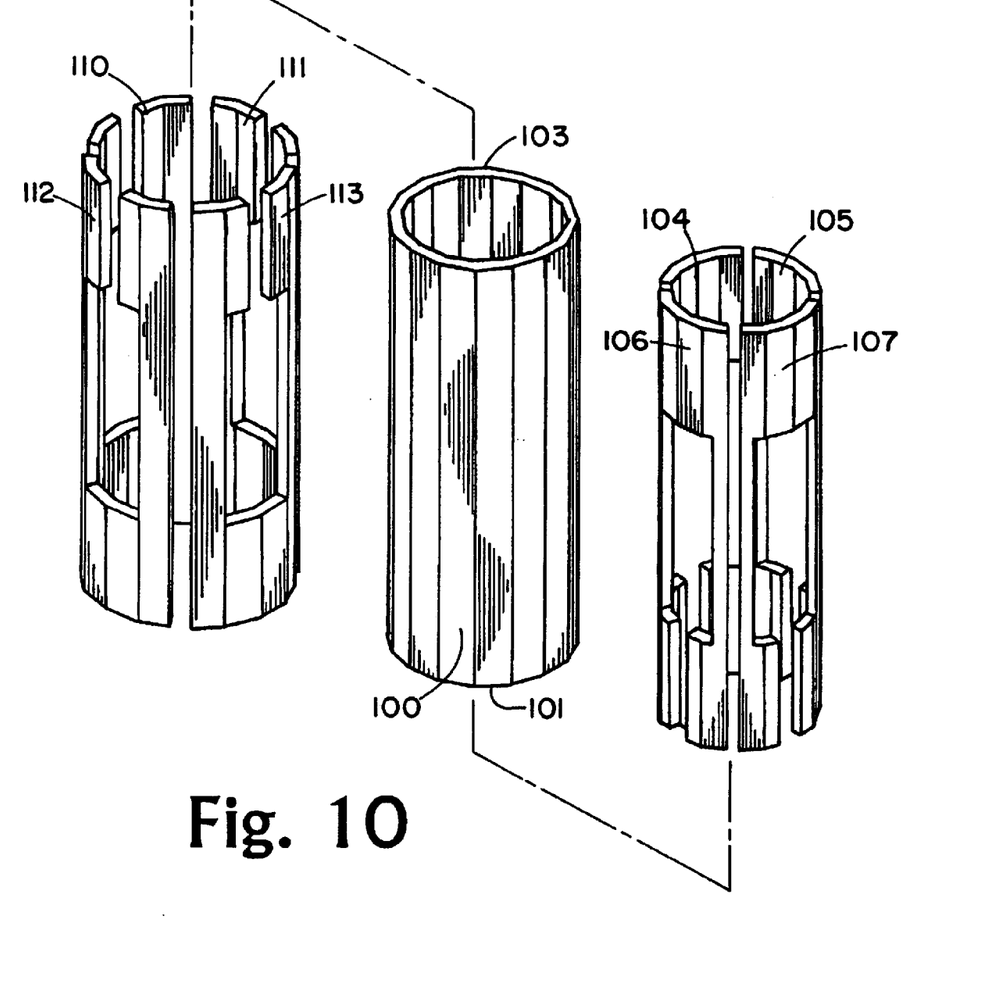
FIG. 10 is an exploded view of a quadrupole embodiment of the present invention.

Another embodiment of the present invention is directed toward a quadrupole cylindrical MRI probe, as shown in FIG. 10. This embodiment of the invention comprises a cylindrical dielectric 100 having a first substrate end 101, a second substrate end 103, a thickness in the range of 1–3000 microns, and a dielectric constant in the range of 1–1,000.

This cylindrical dielectric further comprises four inner surface regions, each of which has a surface area in the range of 0.5–15000 square millimeters. Each inner surface region defines a radial quadrant of the inner surface of the cylindrical dielectric.

This cylindrical dielectric further comprises four outer surface regions, each of which has a surface area in the range of 0.5–10,000 square millimeters. Each outer surface region defines a radial quadrant of the outer surface of the cylindrical dielectric.

This quadrupole embodiment of the invention further comprises four inner conducting layers 104–107, as shown in FIG. 10. Each inner conducting layer is deposited on an inner surface region. In a preferred embodiment, each inner conducting layer comprises a first finger like projection opposite a second finger like projection, to form a gap facing said first substrate end.

In a preferred quadrupole embodiment, the invention further comprises four outer conducting layers 110–113, as shown in FIG. 10. Each outer conducting layer is deposited on an outer surface region. In a preferred embodiment, each outer conducting layer comprises a first finger like projection opposite a second finger like projection to form a gap facing said second substrate end.

Figure 11:
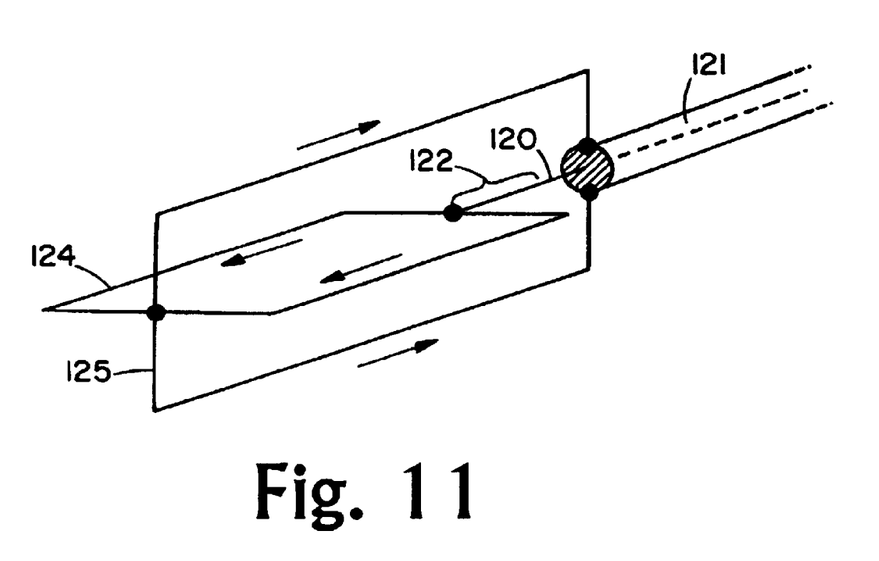
FIG. 11 is an isometric view of a cylindrical embodiment of the present invention.

In another preferred quadrupole embodiment, the invention further comprises a coaxial cable 120 comprising a first region 121 extending longitudinally through the cylindrical dielectric. The coaxial cable further comprises a second region 122 extending outward beyond the first or second end of the cylindrical dielectric. In another preferred embodiment, the invention further comprises a first loop 124 conductively connected to the second region of the coaxial cable and oriented to define a first plane, as shown in FIG. 11. In another preferred embodiment, the probe further comprises a second loop 125 conductively connected to the first loop and oriented to define a second plane that is substantially perpendicular to the first plane, as shown in FIG. 11. The first loop is also conductivley connected to one of the conducting layers of the cylindrical dielectric, as further shown in FIG. 11.

In a preferred embodiment of the cylindrical, quadrupole MRI probe, each of the conducting layers comprises at least one right angle bend, as shown in FIG. 10. In another preferred embodiment, each of the conducting layers comprises a central opening and the dielectric, inner conducting layer, and outer conducting layer are sufficiently thin to have elastic properties. These elastic properties result in the cylindrical probe being deformable such that it can be radially expanded or contracted within a bodily lumen.

Figure 6:
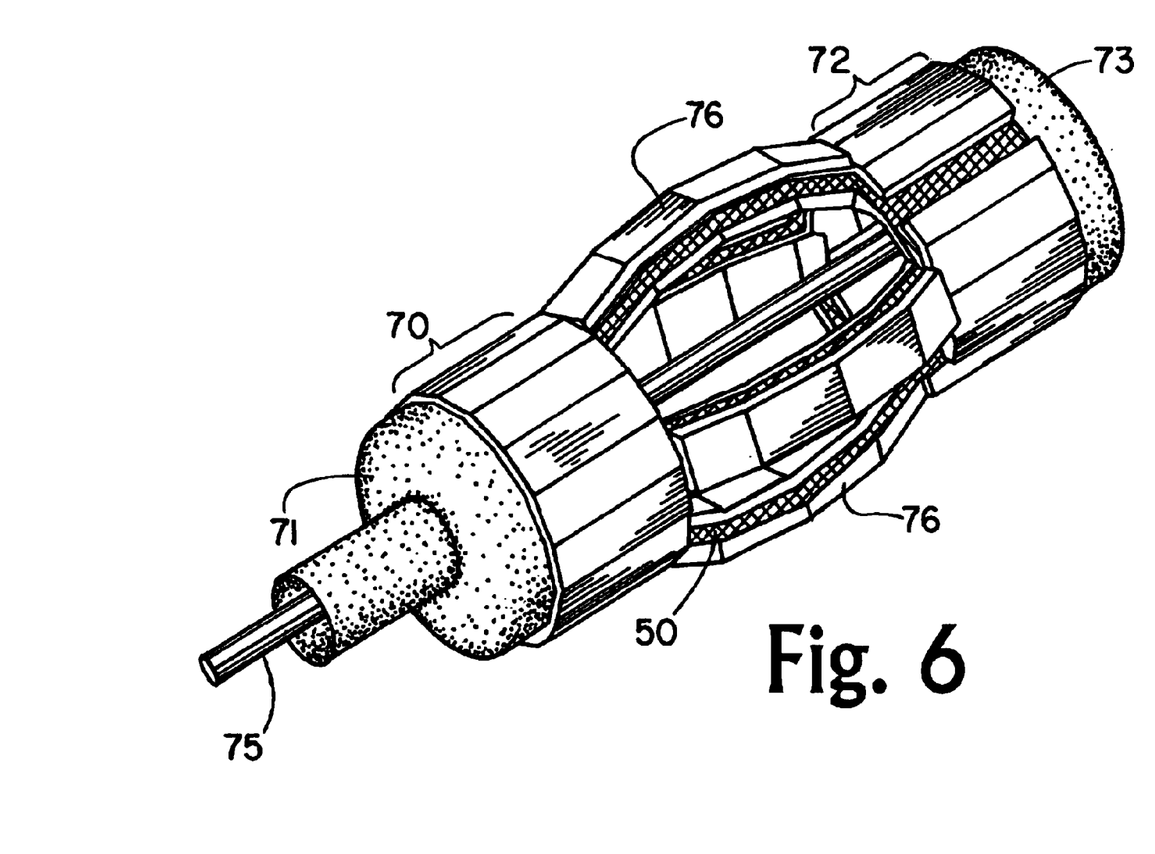
FIG. 6 is an isometric view of an expandable cylindrical embodiment of the present invention.

In another preferred embodiment, the invention is directed to a cylindrical expandable MRI probe, as shown in FIG. 6. This embodiment comprises a dielectric 50 having a thickness in the range of 1–3,000 microns, a dielectric constant in the range of 1–1,000, a first surface having a surface area in the range of 0.5–10,000 square millimeters, and second surface having a surface area in the range 0.5–10,000 square millimeters. This embodiment further comprises a first conducting layer deposited on the first surface and second conducting layer deposited on the second surface, to form a dielectric sandwich. The dielectric sandwich further comprises a first end region 70, a second end region 72, and at least two radially opposed deflection arms 76 connecting the end regions, as shown in FIG. 6. Each deflecting arm is sufficiently elastic to be deflected in response to a compressive force supplied between the first and second end regions.

In a preferred embodiment, the cylindrical expandable MRI probe further comprises a first metallic plug 71 affixed to the first end region, and a second metallic plug 73 affixed to the second end region. The first metallic plug comprising a central channel.

This embodiment further comprises a guide wire 75 slidably extending through the central channel and connected to the first plug such that when the guide wire is pulled away from the first plug, it causes the second end region to be pulled toward the first end region and the deflection arms to be deflected radially outward, as shown in FIG. 6.

In a preferred embodiment of the expandable, cylindrical, quadrupole MRI probe, the inner and outer conducting layers comprise copper. In another preferred embodiment of the expandable, cylindrical, quadrupole MRI probe, the dielectric layer comprises yttrium stabilized zirconia.

The foregoing disclosure and description of the invention are illustrative and explanatory. Various changes in the size, shape, and materials, as well as in the details of the illustrative construction may be made without departing from the spirit of the invention.

What is claimed is:

1. An intraluminal MRI probe comprising:
   a. a first rectangular dielectric sandwich comprising two opposing long sides, two opposing short sides, a dielectric substrate having a thickness in the range of 1–3000 microns, a dielectric constant in the range of 1–1000, a first surface having a surface area in the range of 0.5–10,000 square millimeters, and a second surface having a surface area in the range of 0.5–10,000 square millimeters, a first conducting layer deposited on said first surface, and a second conducting layer deposited on said second surface; a second rectangular dielectric sandwich positioned to face said first sandwich and comprising two opposing long sides, two opposing short sides, a dielectric substrate having a thickness in the range of 1–3000 microns, a dielectric constant in the range of 1–1,000, a first surface having a surface area in the range of 0.5–10,000 square millimeters, and a second surface having a surface area in the range of 0.5–10,000 square millimeters, a first conducting layer deposited on said first surface, a first conducting layer deposited on said first surface, and a second conducting layer deposited on said second surface;

b. a third rectangular dielectric sandwich comprising two opposing long sides, two opposing short sides, a dielectric substrate having a thickness in the range of 1–3000 microns, a dielectric constant in the range of 1–1,000, a first surface having a surface area in the range of 0.5–10,000 square millimeters, and a second surface having a surface area in the range of 0.5–10,000 square millimeters, a first conducting layer deposited on said first surface, a first conducting layer deposited on said first surface, and a second conducting layer deposited on said second surface, said third rectangular dielectric sandwich positioned such that one of its long sides is contiguous with a long side of said first sandwich and the other of its long sides is contiguous with a long side of said second sandwich; and c. a fourth rectangular dielectric sandwich comprising two opposing long sides, two opposing short sides, a dielectric substrate having a thickness in the range of 1–3000 microns, a dielectric constant in the range of 1–1,000, a first surface having a surface area in the range of 0.5–10,000 square millimeters, and a second surface having a surface area in the range of 0.5–10,000 square millimeters, a first conducting layer deposited on said first surface, a first conducting layer deposited on said first surface, and a second conducting layer deposited on said second surface, said fourth rectangular dielectric sandwich positioned to face said third sandwich such that one of the fourth sandwich's long sides is contiguous with a long side of said first sandwich and the other of its long sides is contiguous with a long side of said second sandwich and further such that the four sandwiches define a rectangular solid internal volume and the first conducting layer of each sandwich faces said internal volume.

2. The probe of claim 1, wherein each of said first and said second conducting layers comprises a central opening.

3. The probe of claim 1, wherein each of said first conducting layers comprises a first end opposite a second end to form a first gap and each of said second conducting layers comprises a first end opposite a second end to form a second gap.

4. The probe of claim 3, further comprising:

a. a first dielectric plate placed over each of said first gaps, said first dielectric plates having a dielectric constant in the range of 1–1,000;

b. a second dielectric plate placed over each of said first gaps, said second dielectric plates having a dielectric constant in the range of 1–1,000;

c. a first conducting plate placed over each of said first substrate plates; and d. a second conducting plate placed over each of said second substrate plates.

* * * * *